(12) United States Patent
Koizumi et al.

(10) Patent No.: US 6,871,058 B2
(45) Date of Patent: Mar. 22, 2005

(54) FREQUENCY CONVERSION CIRCUIT

(75) Inventors: Haruhiko Koizumi, Suita (JP); Katsushi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 362 days.

(21) Appl. No.: 10/114,029

(22) Filed: Apr. 3, 2002

(65) Prior Publication Data

US 2002/0146997 A1 Oct. 10, 2002

(30) Foreign Application Priority Data

Apr. 4, 2001 (JP) ........................................ 2001-105848

(51) Int. Cl.⁷ ................................................ H04B 1/26
(52) U.S. Cl. ...................... 455/323; 455/326; 455/333; 327/113
(58) Field of Search ................................ 455/323, 333, 455/317, 313, 130, 196.1, 255, 325, 326, 319, 334; 327/113, 356, 408, 119

(56) References Cited

U.S. PATENT DOCUMENTS

| | | | | |
|---|---|---|---|---|
| 5,306,969 A | * | 4/1994 | Kimura | ........................ 327/113 |
| 5,448,497 A | * | 9/1995 | Ashar et al. | .................... 716/6 |
| 5,465,419 A | | 11/1995 | Zimmermann | |
| 5,517,688 A | * | 5/1996 | Fajen et al. | .................. 455/333 |
| 5,689,207 A | | 11/1997 | Nakatsuka et al. | |
| 6,160,425 A | * | 12/2000 | Laurent et al. | .............. 327/113 |
| 6,388,501 B2 | * | 5/2002 | Chien | .......................... 327/355 |
| 6,639,446 B2 | * | 10/2003 | Komurasaki et al. | ........ 327/355 |
| 6,671,505 B1 | * | 12/2003 | Koizumi | ...................... 455/333 |

FOREIGN PATENT DOCUMENTS

| | | |
|---|---|---|
| JP | 3 46806 | 2/1991 |
| JP | 537245 | 2/1993 |
| JP | 6204751 | 7/1994 |
| JP | 10 341118 | 12/1998 |
| JP | 2000 295042 | 10/2000 |

OTHER PUBLICATIONS

Japanese Office Action dated May 21, 2004 with English translation.

* cited by examiner

*Primary Examiner*—Sonny Trinh
(74) *Attorney, Agent, or Firm*—Stevens, Davis, Miller & Mosher, LLP

(57) ABSTRACT

The present invention provides a frequency conversion circuit capable of reducing current without impairing high frequency characteristics. A local oscillator amplifier is formed of a first field effect transistor. A source thereof is grounded by a first capacitor in terms of high frequency, and a gate thereof is connected to one end of each of first and second resistors. The other end of the first resistor is grounded, and the other end of the second resistor is connected to a voltage supply terminal. An intermediate frequency amplifier is formed of a second field effect transistor. A source thereof is grounded through a third resistor and a second capacitor that are connected in parallel with each other. A drain thereof is connected to an intermediate frequency signal output terminal through a third capacitor and an intermediate frequency output matching circuit. The source of the first field effect transistor and the drain of the second field effect transistor are connected through an AC blocking circuit.

3 Claims, 3 Drawing Sheets

PRIOR ART

FREQUENCY CONVERSION CIRCUIT

BACKGROUND OF THE INVENTION

1. Field of the Invention

This invention relates to a frequency conversion circuit used in a receiving part of wireless telecommunications equipment, especially of cellular telephones or satellite phones.

2. Description of the Related Art

In the field of wireless telecommunications, severe demand to improve the function/performance of a high frequency unit is growing year by year. In a frequency conversion circuit of a receiving part of the high frequency unit, an intense demand to reduce a consumption current has been made especially in order to lengthen the standby time of equipment.

A conventional frequency conversion circuit will be hereinafter described with reference to a drawing.

FIG. 3 shows a conventional frequency conversion circuit disclosed in Japanese Published Unexamined Patent Application No. Hei-6-204751. The frequency conversion circuit in this publication is characterized by being superior in intermodulation distortion and conversion gain, which are important high-frequency characteristics in the frequency conversion circuit.

The frequency conversion circuit of FIG. 3 is comprised of a local oscillator (LO) amplifier 51 for amplifying a LO signal, a mixer 52 for performing a frequency conversion from a radio frequency (RF) signal to an intermediate frequency (IF) signal, and an IF amplifier 53 for amplifying the IF signal that has undergone the frequency conversion.

The LO amplifier 51 is formed of a field effect transistor 54. The mixer 52 is formed of a field effect transistor 55. The IF amplifier 53 is formed of a field effect transistor 56. All sources of the field effect transistors 54, 55, and 56 are grounded.

A gate of the field effect transistor 54 is grounded through a resistor 57 and a resistor 58, and is connected to a LO signal input terminal 60 through a LO input matching circuit 59. A LO signal is input to the LO signal input terminal 60. A drain of the field effect transistor 54 is connected to a voltage supply terminal 62 through a load inductor 61, and is connected to a gate of the field effect transistor 55 through a capacitor 63.

A drain of the field effect transistor 55 is connected to a RF signal input terminal 65 through a RF input matching circuit 64, and is connected to a gate of the field effect transistor 56 through a filter 66.

A drain of the field effect transistor 56 is connected to an IF signal output terminal 68 and a voltage supply terminal 69 through an IF output matching circuit 67.

A cathode of a diode 70 is connected to the gate of the field effect transistor 55, and an anode of the diode 70 is connected to a connection point between the resistors 57 and 58.

The LO input matching circuit 59, the RF input matching circuit 64, and the IF output matching circuit 67 are designed to match characteristic impedance in the frequency where each circuit is used. This characteristic impedance is generally 50 Ω.

Next, the operation of the conventional frequency conversion circuit will be described. As an example, the frequency to be used is set as follows. The RF signal is 2100 MHz, the LO signal is 2300 MHz, and the IF signal is 200 MHz. A power-supply voltage is set to 3V.

In order to operate the frequency conversion circuit, it is necessary to first apply a voltage to the voltage supply terminals 62 and 69. A LO signal that has been input from the LO signal input terminal 60 is amplified by the field effect transistor 54 of the LO amplifier 51, and then is input to the gate of the field effect transistor 55 of the mixer 52 through the capacitor 63. On the other hand, a RF signal that has been input from the RF signal input terminal 65 is input to the drain of the field effect transistor 55.

At this moment, the gate voltage of the field effect transistor 55 is greatly changed by the input LO signal, and, as a result, the channel resistance of the field effect transistor 55 shows weak nonlinearity with respect to time. By the nonlinearity of the channel resistance, the RF signal is subjected to a frequency conversion to an IF signal. The converted IF signal is amplified by the field effect transistor 56 of the IF amplifier 53, and then is output from the IF signal output terminal 68. Since frequency components other than the IF signal are unnecessary, they are removed by the filter 66.

In the present circumstances, this frequency conversion circuit needs to set each current consumed by the LO amplifier 51 and the IF amplifier 53 at 5 mA, in order to satisfy the high-frequency characteristics. Therefore, the frequency conversion circuit consumes a total current of 10 mA.

However, the current value of the LO amplifier 51 and that of the IF amplifier 53 are each set as necessary, at a minimum value by which desired high-frequency characteristics can be achieved. Therefore, the circuit configuration of the conventional frequency conversion circuit cannot greatly reduce the current without lowering the high-frequency characteristics.

SUMMARY OF THE INVENTION

It is therefore an object of the present invention to provide a frequency conversion circuit capable of reducing consumption current without deteriorating high-frequency characteristics such as an intermodulation distortion and a conversion gain.

The frequency conversion circuit of the present invention includes a first amplifier formed of a first field effect transistor for amplifying a LO signal input to a gate and outputting it from a drain, a mixer for converting a RF signal into an IF signal on the basis of a LO signal output from the first amplifier, and a second amplifier formed of a second field effect transistor for amplifying an IF signal that is output from the mixer and is input to the gate and outputting it from the drain.

One end of a first resistor is grounded, and the other end of the first resistor is connected to the gate of the first field effect transistor. A second resistor is connected between an external voltage source and the first field effect transistor. One end of a first capacitor is grounded, and the other end of the first capacitor is connected to the source of the first field effect transistor.

One end of a third resistor is grounded, and the other end of the third resistor is connected to the gate of the second field effect transistor. A second capacitor and a fourth resistor are connected in parallel with each other, and one end of each of the second capacitor and the fourth resistor is grounded, the other end of each of of the second capacitor and the fourth resistor are connected to the source of the second field effect transistor.

An AC blocking circuit for passing direct current and blocking alternating current is connected between the source of the first field effect transistor and the drain of the second field effect transistor.

According to the structure of the present invention, the current of the first amplifier and the current of the second amplifier are shared with each other, and therefore the current can be reduced to half the conventional one without deteriorating the high-frequency characteristics. However, to do so, it is preferable to apply a bias so that the drain-to-source voltage (between the drain and the source) of the field effect transistor of each amplifier can reach about half the supply voltage.

Further, since the AC blocking circuit separates the LO signal and the IF signal from each other, there is no deterioration in high-frequency characteristics resulting from mutual interference.

In the frequency conversion circuit of the present invention, the mixer is structured as follows, for example. In detail, this mixer is formed of the third field effect transistor the source of which is grounded. A LO signal is input to the gate of the third field effect transistor, the RF signal is then input to the drain of the third field effect transistor, and the IF signal is output from the drain of the third field effect transistor.

According to this structure, the same advantageous effect as the above-mentioned one of the present invention can be achieved, and, in addition, the frequency conversion circuit can greatly reduce consumption current, because the mixer never consumes current.

In the frequency conversion circuit of the present invention, the AC blocking circuit is formed of, for example, an inductor. This inductor is set at a value according to which it can be used as a sufficiently high impedance with respect to the LO signal, and it can be used as an output matching circuit with respect to the IF signal.

An inductance value of the inductor should be large in order to allow the inductor to act as an AC blocking circuit. However, on the other hand, an optimum value must be selected in order to maximize the gain of the IF amplifier, because the inductor is a load imposed on the IF amplifier.

Furthermore, the frequency of IF signal is normally 100 through 300 MHz, which is smaller with about a single-digit difference than the frequency of LO signal, and therefore, if the inductance value of the inductor is set between, for example, 100 nH through 400 nH, it can be caused to act as a load imposed on the IF amplifier while maintaining the separation of the LO signal and the IF signal. Therefore, according to this structure, the same advantageous effect as the above-mentioned one of the present invention can be achieved, and, in addition, the separation of the LO signal and the IF signal and the gain maximization of the IF amplifier can be simultaneously realized with a simple circuit if an optimum inductance value is selected.

As described above, the frequency conversion circuit of the present invention shares the current of the first amplifier with that of the second amplifier, and therefore the current can be reduced to half the conventional one without deteriorating the high-frequency characteristics.

In this example, the frequency of IF signal is set to be smaller with about a single-digit difference than that of LO signal, and therefore the IF signal and the LO signal can be relatively easily separated from each other in the AC blocking circuit. Therefore, high-frequency characteristics are not impaired by interference.

DETAILED DESCRIPTION OF THE PREFERRED EMBODIMENT

An embodiment of the present invention will be described with reference to FIG. 1 and FIG. 2.

Figure 1:
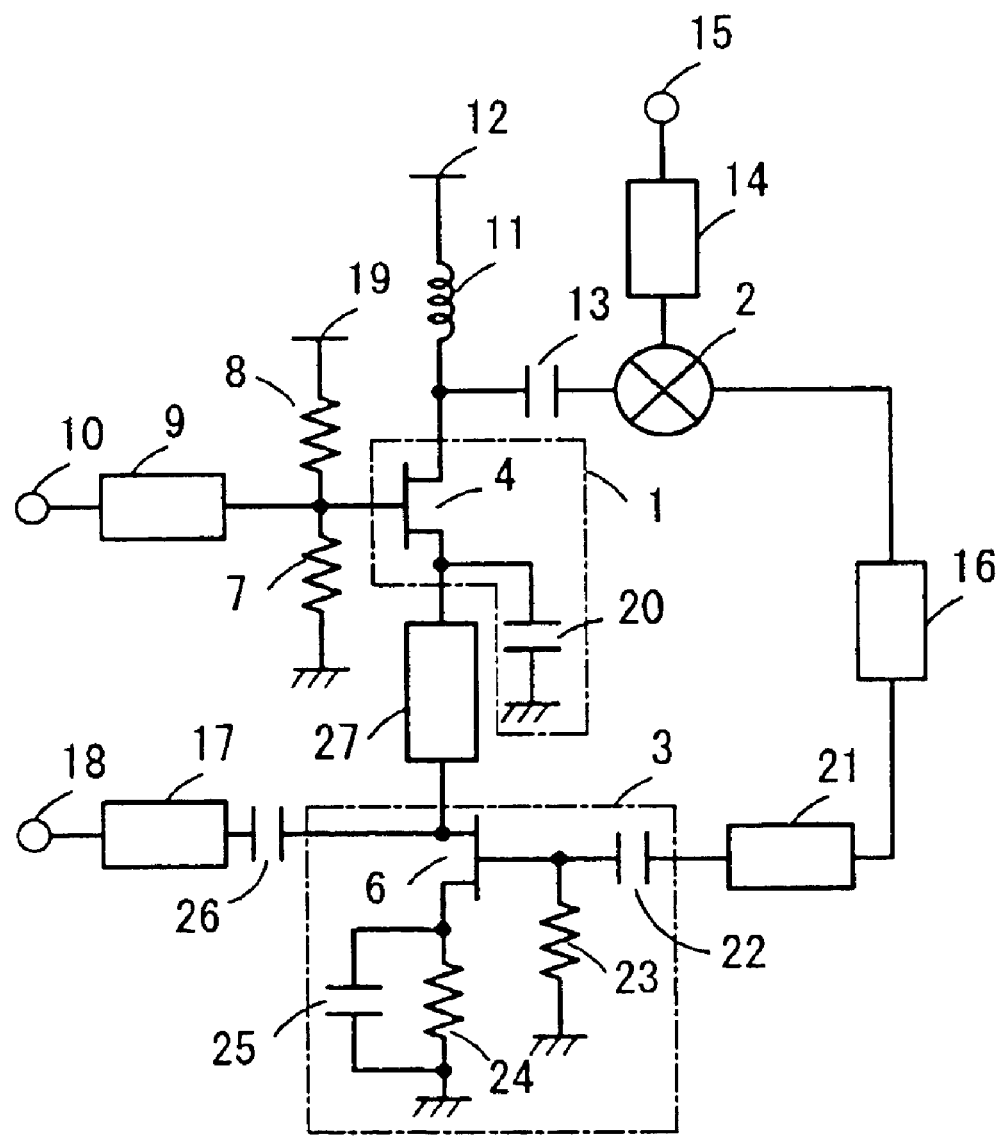
FIG. 1 is a circuit diagram that shows the structure of a frequency conversion circuit according to an embodiment of the present invention.

FIG. 1 is a circuit diagram of a frequency conversion circuit according to the embodiment of the present invention.

The frequency conversion circuit of FIG. 1 is comprised of a LO amplifier 1 for amplifying a LO signal, a mixer 2 for performing a frequency conversion from a RF signal to an IF signal, and an IF amplifier 3 for amplifying the IF signal that has undergone the frequency conversion. The LO amplifier is a first amplifier, and the IF amplifier is a second amplifier.

The LO amplifier 1 is formed of a field effect transistor 4. A source of the field effect transistor 4 is grounded by a capacitor 20 in terms of high frequency. A gate of the field effect transistor 4 is connected to a LO signal input terminal 10 through a LO input matching circuit 9. Further, one end of a resistor 7 is grounded, one end of a resistor 8 is connected to a voltage supply terminal 19, and the gate of the field-effect transistor 4 is connected to the other end of each of the resistors 7 and 8.

A drain of the field effect transistor 4 is connected to a voltage supply terminal 12 through a load inductor 11, and is connected to the mixer 2 through a capacitor 13.

The frequency conversion circuit 2 is connected to a RF signal input terminal 15 through a RF input matching circuit 14, and is connected to one end of a filter 16. The other end of the filter 16 is connected to a gate of a field effect transistor 6 that constitutes the IF amplifier 3 through an IF input matching circuit 21 and a capacitor 22.

The gate of the field effect transistor 6 is grounded by a resistor 23, and a source of the field effect transistor 6 is grounded through a resistor 24 and a capacitor 25 that are connected in parallel with each other. A drain of the field effect transistor 6 is connected to an IF signal output terminal 18 through a capacitor 26, which blocks direct current, and an IF output matching circuit 17. Further, the drain of the field effect transistor 6 is connected to the source of the field effect transistor 4 through an AC blocking circuit 27. The AC blocking circuit 27 functions to pass direct current and block alternating current.

The LO input matching circuit 9, the RF input matching circuit 14, and the IF output matching circuit 17 are designed to match characteristic impedance in the frequency where each circuit is used. This characteristic impedance is generally 50 Ω.

Next, the operation of the frequency conversion circuit in this embodiment will be described.

On the frequency conversion circuit of the embodiment of the present invention, the voltage supply terminals 12 and 19 are applied 3 V. The flow of a high frequency signal is as follows. A LO signal input from the LO signal input terminal 10 is amplified by the field effect transistor 4 of the LO amplifier 1, and then is input to the mixer 2 through the capacitor 13. A RF signal input from the RF signal input terminal 15 is subjected to a frequency conversion by a LO signal in the mixer 2 so as to be converted into an IF signal.

The converted IF signal is amplified by the field effect transistor 6 of the IF amplifier 3, and then is output from the IF signal output terminal 18. Since frequency components other than the IF signal are unnecessary, they are removed by the filter 16.

The LO amplifier 1 is used to amplify the LO signal. If the gain of the LO amplifier 1 is small, the mixer cannot be driven, thus impairing the high-frequency characteristics. In order to prevent this, the drain to source voltage of the field effect transistor 4 needs to be at least knee voltage or more. The knee voltage is a constant that depends on the gate width and gate length of a field effect transistor to be used or depends on a process in which a field effect transistor is manufactured. The knee voltage is about 0.7 V.

What is needed to raise the drain to source voltage of the field effect transistor 4 more than the knee voltage in the frequency conversion circuit of this embodiment is to set the gate voltage of the field effect transistor 4 at a high value. To do so, a voltage division ratio in the resistors 7 and 8 needs to be appropriately selected. This voltage division ratio changes in accordance with the gate width and gate length of a field effect transistor to be used or a process in which the field effect transistor is manufactured. In general, the drain to source voltage of the field effect transistor 4 is set to be about half the supply voltage. It is about 1.5 V in this embodiment.

Also in the IF amplifier 3, voltage that is about half the supply voltage is applied between the drain and the source of the field effect transistor 6 at this moment, and therefore there is no characteristics deterioration. Further, the AC blocking circuit 27 maintains the high-frequency separation of the LO amplifier 1 and the IF amplifier 3.

The current of the frequency conversion circuit according to the embodiment of the present invention is determined by the voltage applied onto the gate of the field effect transistor 4 and the resistor 24. As described above, the voltage applied onto the gate of the field effect transistor 4 is determined by the resistors 7 and 8.

If the aforementioned condition is established so that the current consumed by the LO amplifier 1 and the IF amplifier 3 is 5 mA, which is equal to that of the conventional frequency conversion circuit, for comparison, the current consumed by each amplifier does not change, and the same high-frequency characteristics are obtained.

On the other hand, the current flows from the voltage supply terminal 12 to the load inductor 11, to the field effect transistor 4, to the AC blocking circuit 27, to the field effect transistor 6, and to the resistor 24 in this order. As a result, the consumption current of the LO amplifier 1 and that of the IF amplifier 3 become equal, and can be reduced to half the consumption current 10 mA of the conventional frequency conversion circuit.

Figure 2:
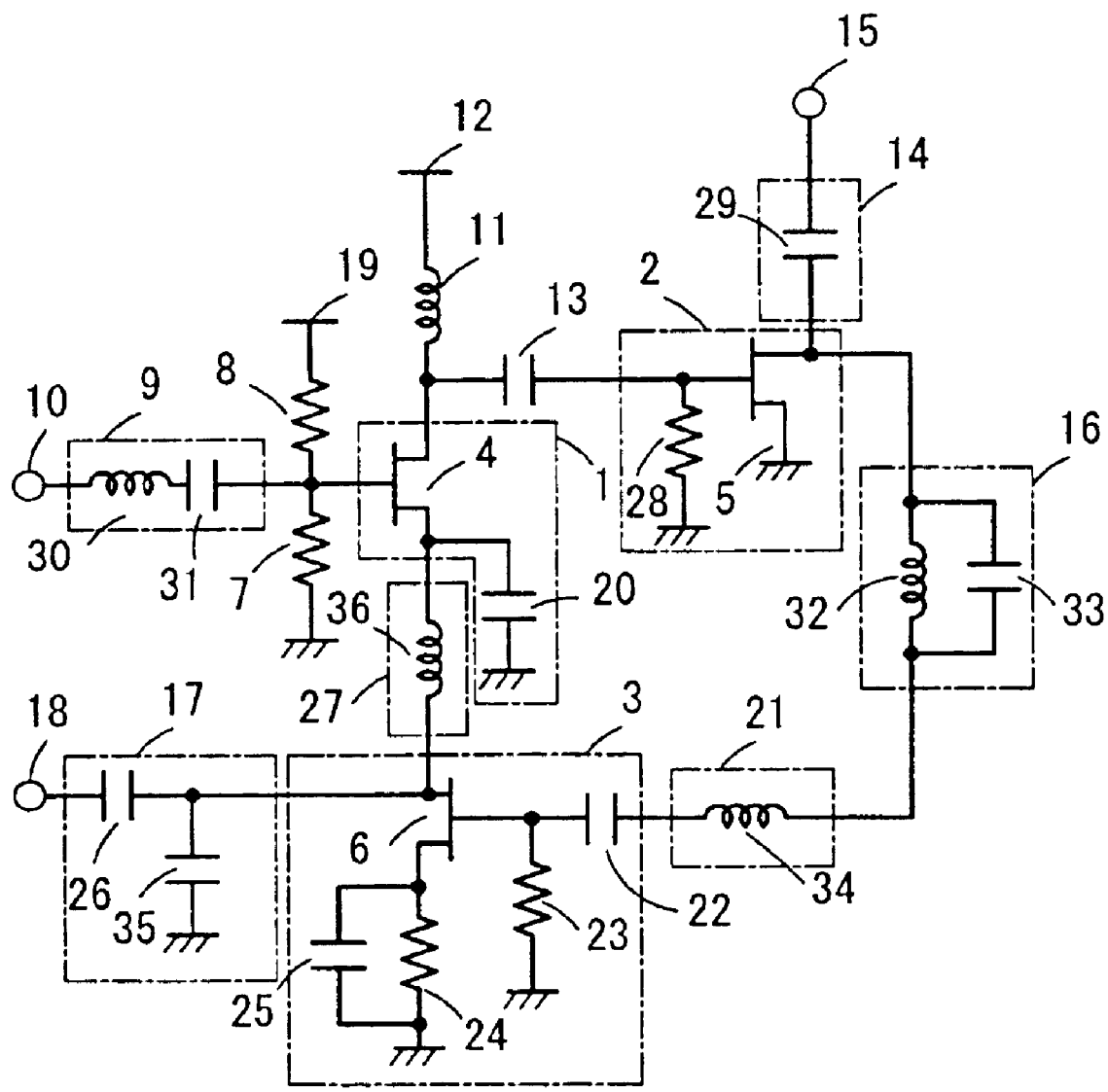
FIG. 2 is a circuit diagram that shows the detailed structure of the frequency conversion circuit according to the embodiment of the present invention.
Figure 3:
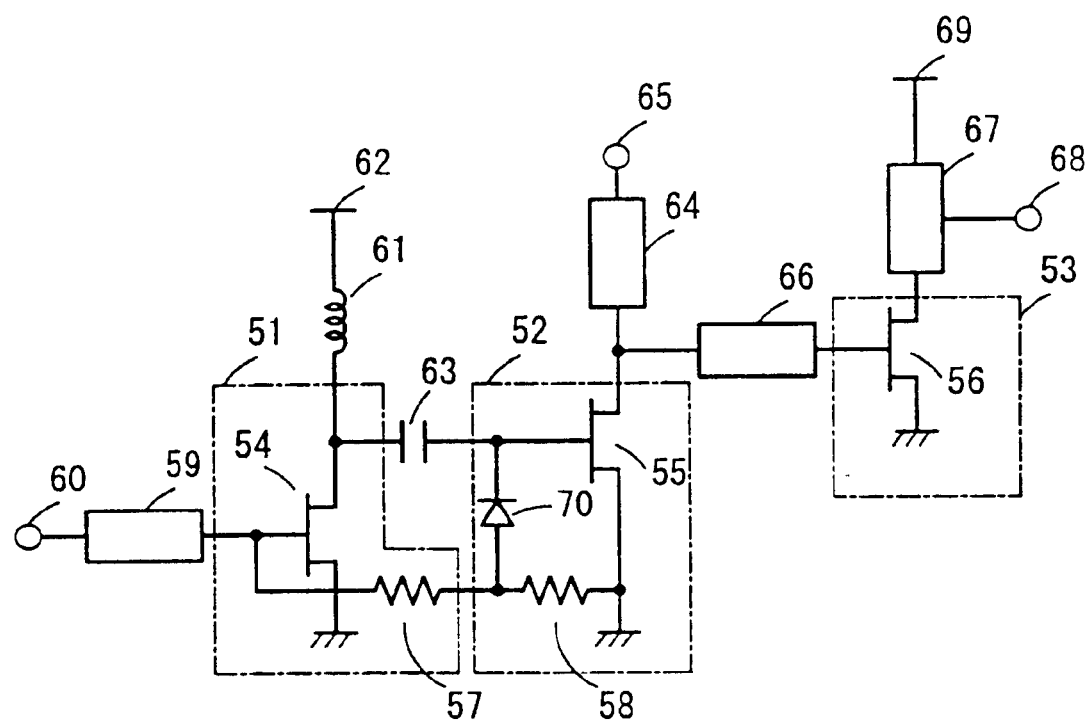
FIG. 3 is a circuit diagram that shows the structure of a conventional frequency conversion circuit.

FIG. 2 shows the details of the mixer 2, the LO input matching circuit 9, the RE input matching circuit 14, the filter Aft 16, the IF input matching circuit 21, and the IF output matching circuit 17 in the frequency conversion circuit shown in FIG. 1.

In FIG. 2, the mixer 2 is comprised of a field effect transistor 5 a source of which is grounded and a resistor 28 one end of which is connected to the gate of the field effect transistor 5 and the other end of which is grounded. The gate of the field effect transistor 5 is connected to the capacitor 13, and a drain of the field effect transistor 5 is connected to the RF input matching circuit 14 and to the filter 16.

The RF input matching circuit 14 is formed of a capacitor 29, and is connected between the RF signal input terminal 15 and the drain of the field effect transistor 5. The LO input matching circuit 9 is comprised of an inductor 30 and a capacitor 31 that are connected in series, and is connected between the LO signal input terminal 10 and the gate of the field effect transistor 4. The filter 16 is comprised of an inductor 32 and a capacitor 33 that are connected in parallel with each other, and is connected between the drain of the field effect transistor 5 and the IF input matching circuit 21. The IF input matching circuit 21 is formed of an inductor 34, and is connected between the filter 16 and the capacitor 22. The IF output matching circuit 17 is comprised of the capacitor 26 and a capacitor 35 one end of which is grounded. The capacitor 26 is connected between the drain of the field effect transistor 6 and the IF signal output terminal 18.

The inductance value of the inductor 32 that constitutes the filter 16 and the capacitance value of the capacitor 33 are determined so as to pass the IF signal and block the other signal. If the RF signal is 2100 MHz, the LO signal is 2300 MHz, and the IF signal is 200 MHz as frequencies to be used, the inductance value of the inductor 32 should be 3.9 nH, and the capacitance value of the capacitor 33 should be 1 pF.

IF output matching is achieved by the inductor 36 that constitutes the AC blocking circuit 27 and the capacitors 26 and 35 that constitute the IF output matching circuit 17. For example, the matching is achieved by setting the inductance value of the inductor 36 at 100 nH, the capacitance value of the capacitor 26 at 6 pF, and the capacitance value of the capacitor 35 at 5 pF. Although the inductor 36 must block the LO signal simultaneously, the inductance value of 100 nH is large enough to block the LO signal of 2300 MHz. Therefore, the isolation of the LO amplifier 1 from the IF amplifier 3 is well maintained.

In this embodiment, an example was given in which the field effect transistors 4 and 6 of the LO amplifier 1 and the IF amplifier 3, respectively, have a single-gate structure. However, the same effect can be achieved even if one of or both of the field effect transistors 4 and 6 have a dual-gate structure.

What is claimed is:

1. A frequency conversion circuit comprising:

a first amplifier formed of a first field effect transistor for amplifying a local oscillator signal input to a gate and outputting it from a drain;

a mixer for converting a radio frequency signal into an intermediate frequency signal on the basis of a local oscillator signal output from the first amplifier;

a second amplifier formed of a second field effect transistor for amplifying an intermediate frequency signal that is output from the mixer and is input to a gate and outputting it from a drain;

a first resistor one end of which is grounded, the other end of which connected to the gate of the first field effect transistor;

a second resistor connected between an external power source and the gate of the first field effect transistor;

a first capacitor one end of which is grounded, the other end of which connected to the source of the first field effect transistor;

a third resistor one end of which is grounded, the other end of which connected to the gate of the second field effect transistor;

a second capacitor and a fourth resistor which are connected in parallel with each other, and one end of each of which is grounded, the other end of each of which connected to the source of the second field effect transistor; and an AC blocking circuit for passing direct current and blocking alternating current, the AC blocking circuit connected between the source of the first field effect transistor and the drain of the second field effect transistor.

2. The frequency conversion circuit of claim 1, wherein the mixer is formed of a third field effect transistor a source of which is grounded, a local oscillator signal is input to a gate of the third field effect transistor, a radio frequency signal is input to a drain of the third field-effect transistor, and an intermediate frequency signal is output from the drain of the third field effect transistor.

3. The frequency conversion circuit of claim 1, wherein the AC blocking circuit is formed of an inductor that is sufficiently high impedance with respect to a local oscillator frequency, and that is set at a value usable for output matching with respect to an intermediate frequency.

* * * * *